United States Patent [19]

Schwenk et al.

[11] Patent Number: 5,807,008
[45] Date of Patent: Sep. 15, 1998

[54] FASTENING DEVICE

[75] Inventors: Hans-Martin Schwenk; Klaus Kern, both of Straubenhardt; Uwe Rieger, Karlsbad, all of Germany

[73] Assignee: Schroff GmbH, Straubenhardt, Germany

[21] Appl. No.: 758,547

[22] Filed: Nov. 29, 1996

[30] Foreign Application Priority Data

Dec. 1, 1995 [DE] Germany .................. 195 44 834.0

[51] Int. Cl.⁶ ............................................. F16B 2/24
[52] U.S. Cl. ........................ 403/21; 403/19; 403/363; 312/265.1
[58] Field of Search ............... 403/21, 256, 257, 403/243, 329, 205, 207, 363, 405.1, 406.1, 19; 312/265.1, 265.4, 265.2, 265.3, 223.1

[56] References Cited

U.S. PATENT DOCUMENTS

| 2,140,628 | 12/1938 | Hoff | 403/21 |
| 2,205,323 | 6/1940 | Tinnerman | 403/21 |
| 2,737,269 | 3/1956 | Flora | 403/21 |
| 3,110,372 | 11/1963 | Pierce et al. | 403/21 |
| 3,265,455 | 8/1966 | Ferdinand et al. | 312/265.1 X |

FOREIGN PATENT DOCUMENTS

| 2408748 | 7/1979 | France | 403/363 |
| 2496226 | 6/1982 | France | 403/405.1 |
| 2518192 | 6/1983 | France | 403/405.1 |
| 2010379 | 6/1979 | United Kingdom | 403/405.1 |

*Primary Examiner*—Harry C. Kim
*Attorney, Agent, or Firm*—Merchant, Gould, Smith, Edell, Welter & Schmidt

[57] ABSTRACT

The discovery concerns a fastening device for hinge parts and wall elements on frames of equipment enclosures in the electronic industry, whose sectional side rails show a longitudinal groove. A sprung u-clip 13 showing two thread carriers 16,23, is attachable in this longitudinal groove. A spring tongue 20 on the u-clip faces outward and reaches into a mounting on the longitudinal groove. The longitudinal groove bears rows of through holes corresponding to the thread carrier 16,23 for attachment screws.

6 Claims, 1 Drawing Sheet

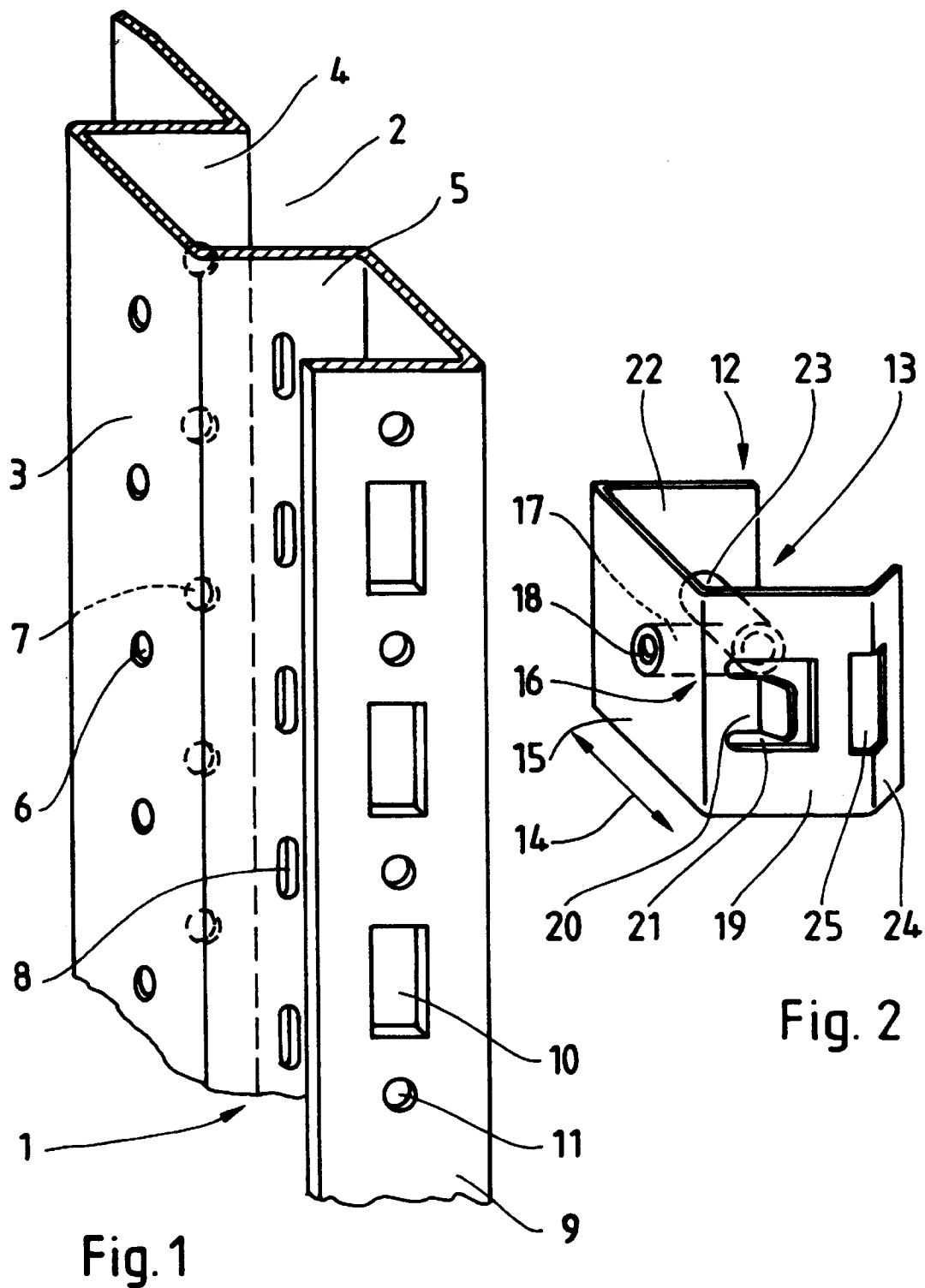

FASTENING DEVICE

BACKGROUND OF THE INVENTION

The discovery concerns a fastening device for hinge parts and wall elements on frames from equipment cabinets in the electronic industry, in which the frame shows four vertical sectional side rails on which attachable fastening elements exist.

The discovery finds application especially in the modular construction method used in electronic cabinets, that essentially consists of a basic frame on which top surfaces, bottoms, back walls, side walls, and swinging doors are attached. The basic frames of several modules on top of one another in a row can be connected together.

One such example of a framework of an instrument cabinet for the electronics industry, is seen in the German registered design document 87 03 617. The application as described shows vertical side rails that were made preferably in sectional technique, whereby stretched aluminum-pressed track sections or rolled steel sections come into use.

It is known to screw extension pieces, such as door hinges and the bolting elements from track locks, directly onto the vertical sectional side rails of the edge frame. If this takes place from the outside the side rail bears a thread. If the screwing takes place from the inside out, the sectional side rail contains a through hole and a thread is seen on the extension piece.

Furthermore the extension piece is known to connect to the side rails through the use of its own bayonet-connections. Also the use of blind rivet nuts or blunt materials for self tapping metal screws is known.

With the DD-patent document 135 677, a screw fastener has become common in building units with holed sectional rails equipped with a unshaped edge. With these, one finds springy fasteners out of plastic, in whose middle an extension of the conclusive picture of an industry standard nut is designed. Their ends bear semi-circular shaped handles, which in an installed state, rest in two fastening holes of the sectional track.

In another group of fastening devices for framework in equipment cabinets, the assembly grooves showing additional fastening sections are designed on the side frames. In these assembly grooves are transversally movable L-shaped assembly angles that carry fastening threads, and are adjustable to a desired height. On the assembly corner of the enclosure its front plate can be screwed on, whereby the fastening is achieved through a clamping effect.

Quadratic screw nuts, on which a bow-shaped spring element is set on edge, are commonly known in the screw-type fastening of prefabricated components in electronic cabinets which show horizontal- and vertical section T-grooves. Such screw nuts allow themselves to be led from the side into the slat of the T-groove and can be put in place in the groove after a 90 degree turn. The nuts are pushed longitudinally in the T-groove and in order to hold the prefabricated component, will be fastened by the spring element on an already barred location. Here the fastening also works alone through the clamping effect.

The disadvantage of all of the already mentioned fastening devices is that they are either to costly or technically lavish, that they are poor to have at hand or are only produced through the necessary expenditures.

The task of the discovery exists therein, to propose a fastening device for door strikers, hinge pieces, and for cabinet elements on the side rails of frames of electronic cabinets, which can be made for a reasonable price and is quick to assemble to the desired height, and easy to disassemble. Moreover allowing for a simple connection, through the use of a screwed connection, of modular type cabinets on top of one another in a row,.

The solution of the proposed task will be assumed to be a fastening device for hinge and wall elements and frame shelves from equipment cabinets in the electronic industry, in which the frame shows four vertical sectional side rails on which attachable fastening elements exist.

The proposed task will be solved, such that the sectional side rail possesses a cross-section u-shaped longitudinal groove, the longitudinal groove bears through holes on its base wall, the longitudinal groove shows mountings on its one side wall, the fastening elements are box-shaped u-clips out of springy material, the u-clip fits into the longitudinal groove, a thread carrier is located on the u-base of the u-clip, the thread carrier aligns with one of the through holes when the fastening element is pushed into the longitudinal groove, whereby fastening screws are screwed through the through holes into the thread carrier, a spring tongue appears on a u-side angle of the u-clip and the spring tongue stands to the outside to mesh in one of the holders in the longitudinal groove.

For the purpose of securing the screw parts or wall elements on the frame edge, the necessary number of designed u-clamps insert on their planned position in the longitudinal groove of the sectional side rail, this makes the screw connection possible.

The longitudinal groove advantageously shows on its other side wall additional through holes. On the other u-side angle of the u-clip a second thread carrier is arranged. Through these measures the fastening possibilities of prefabricated components on the framework are considerably extended.

Provided the longitudinal groove of the sectional side rail is arranged as such, so that it points to the inside of the frame edge, the installation of each piece put on can be screwed on from the outside in.

For that purpose the mountings on the one side wall of the longitudinal side are pictured to mesh the spring tongue and longitudinal holes.

On the one u-side angle of the u-clip a tab can be formed, which is tilted at a blunt angle toward the other u-side angle. Through this tab a removal of the u-clip from the u-shaped longitudinal groove of the sectional side rail is allowed.

The pulling out of the u-clip can happen easily through the use of a tool- for example a screwdriver, when the one u-side angle of the u-clip shows a transverse cut-out from a rectangular base whose opening meshes with the tab. The rectangular cut-out serves to mesh with the tool.

Through an arrangement of the discovery, the thread carriers are cylinder cases carrying inner threads.

The balance of tolerance by assembly is made possible when the thread carriers are long-holed cagenuts.

For cost reasons it can be an advantage when the thread carriers are blunt materials for self tapping metal screws.

In place of them blunt material with formed threads can be provided.

BRIEF DESCRIPTION OF THE FIGURES

The discovery will be more closely explained below with the enclosed drawings at hand. Showing:

FIG. 1 a section of a vertical sectional side rail the frame work of an instrument cabinet in increased approximately twice the normal scale;

FIG. 2 a fastening element with 2 thread carriers, belonging to a sectional side rail as seen in FIG. 1

DETAILED DESCRIPTION OF THE PREFERRED EMBODIMENT(S)

The sectional side rail, as seen in FIG. 1, is a component of a (not shown) framework for an instrument cabinet for the electronics industry. It deals with a rolled steel section, make out of a strip of an approximately 2.5 millimeter thick sheet metal, which is bent at a right angle five times.

The sectional side rail 1 contains a cross-sectional opening towards the inside of the framework u-shaped longitudinal groove 2, with a base wall 3, a side wall 4, and another side wall lying across from the first 5. The base wall 3 of longitudinal groove 2 carries a row of equidistant circular-shaped through holes 6, and the side wall 4 holds a row of additional through holes 7. The through holes 6 and 7 serve to be stuck through by fastening screws. The other sidewall 5 shows mountings in the form of longitudinal holes.

On a side rail 9 or sectional side rail 1, is a row of rectangular cut outs 10 designed in between the holes 11, which provide for the holding and fastening of equipment bases, traverses, building group carriers and other elements, that are however not pictured.

The attachable fastening element 12 on the sectional side rail 1(see FIG. 2) serves as a fastening for (not depicted) hinge pieces as well as wall elements, such as side walls and back walls and the edge frame of the equipment cabinet.

The fastening element 12 is a box shaped bent together u-clip 13 and is made out of a out of a springy metal, namely out of partially hardened sheet metal with a strength of less than one millimeter, which is designed with a corrosive protector. The with 14 of this u-clip 13 is measured as such that it fits and can be shoved from the side into the longitudinal groove 2 the sectional side rail 1.

The U-clip 13 contains a u-base 15, in whose middle a thread carrier 16 is sunk into. This thread carrier 16, is a riveted cylinder casing 17, designed with an inner thread 18. Such that thread carrier 16 can also be a long-holed cagenut (not pictured) or also a material carver, that is also not depicted, that is designed for self threading screws.

On one of the u-angles 19 of the u-clip 13 appears an outside springing spring tongue 20 designed to mesh with one of the mountings 8 in the longitudinal groove 2, when the fastening element 12 is inserted in the longitudinal groove 2. For this reason the spring tongue 20 is bent in its middle towards the outside. The spring tongue 20 is made through a u-shaped punch out 21 of the u-side angle 19.

On the u-side angle 19 of the u-clip 13 a narrow tab 24 is formed which is tilted at a blunt angle toward the other u-side angle 22. When the fastening element 12 is inserted a tapered gap is seen between the other side wall 5 of longitudinal groove 2 and the u-side angle 19. This u-side angle 19 shows a transverse cutout 25 of rectangular cross-section, whose opening meshes a little with the opening of the tab 24. In order to leverage the fastening element 12 out, the opening of the transverse cut-out 25 allows for the insertion of the tip of a screwdriver.

What is claimed is:

1. A frame and fastener device for hinge parts and wall elements on frames for electronic equipment cabinets, in which a frame includes four vertical sectional side rails and on which fastening elements attach, characterized by the following features:

at least one of the sectional side rails (1) possesses a cross-sectional u-shaped longitudinal groove (2), the longitudinal groove (2) includes through-holes (6) formed on its base wall (3), the longitudinal groove (2) includes mountings (8) on its side walls (5), the fastening elements (12) are box-shaped u-clips (13) of springy material having a u-base (15), the u-clips (13) insert into the longitudinal groove (2), on the u-base (15) of the u-clip (13) a thread carrier (16) is found, wherein the thread carrier (16) aligns itself with one of the through holes (6), when the longitudinal groove (2) is pressed into the fastening element (12), whereby fastening screws are screwed in through the through holes (6) into the thread carrier (16), a spring tongue (20) is designed, on a first u-side angle (19) of the u-clip (13), wherein the spring tongue (20) attaches to the outside of one of the mountings (8) of the longitudinal groove (2);

wherein the longitudinal groove (2) includes additional through-holes (7) on its second side wall (4) and on a second u-side angle (22) of the u-clip (13) a second thread carrier (23) is arranged.

2. The device according to claim 1, wherein the mountings (8) define elongated holes on the side wall (5) of the longitudinal groove (2).

3. The device according to claim 1, wherein the thread carriers (16 and 23) are inner threaded (18) cylinder casings (17).

4. The device according to claim 3, wherein the thread carriers (16 and 23) are long-holed cagenuts.

5. The device according to claim 1, wherein the thread carriers (16 and 23) are blunt materials for self tapping metal screws.

6. A frame and fastener device for hinge parts and wall elements on frames for electronic equipment cabinets, in which a frame includes four vertical sectional side rails and on which fastening elements attach, characterized by the following features:

at least one of the sectional side rails possesses a cross-sectional u-shaped longitudinal groove, the longitudinal groove includes through-holes formed on its base wall, the longitudinal groove includes mountings on its side walls, the fastening elements are box-shaped u-clips of springy material having a u-base, the u-clips insert into the longitudinal groove, on the u-base of the u-clip a thread carrier is found, wherein the thread carrier aligns itself with one of the through holes, when the longitudinal groove is pressed into the fastening element, whereby fastening screws are screwed in through the through holes into the thread carrier, a spring tongue is designed, on a first u-side angle of the u-clip, wherein the spring tongue attaches to the outside of one of the mountings of the longitudinal groove, wherein the u-clip includes a tab formed on the first u-side angle, which is tilted at a blunt angle toward a second u-side angle, wherein the first u-side angle of the u-clip includes a transverse cut-out from a rectangular base whose opening reaches the tab.

* * * * *